(12) United States Patent
Tonomura et al.

(10) Patent No.: US 10,773,523 B2
(45) Date of Patent: Sep. 15, 2020

(54) LIQUID DISCHARGE HEAD, LIQUID DISCHARGE APPARATUS, AND PIEZOELECTRIC DEVICE

(71) Applicant: Seiko Epson Corporation, Tokyo (JP)

(72) Inventors: Osamu Tonomura, Matsumoto (JP); Masao Nakayama, Shiojiri (JP); Eiju Hirai, Azumino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/356,299

(22) Filed: Mar. 18, 2019

(65) Prior Publication Data

US 2019/0283426 A1 Sep. 19, 2019

(30) Foreign Application Priority Data

Mar. 19, 2018 (JP) .................................. 2018-050758

(51) Int. Cl.
| | | |
|---|---|---|
| *B41J 2/14* | (2006.01) | |
| *B41J 2/16* | (2006.01) | |
| *H01L 41/09* | (2006.01) | |
| *H01L 41/047* | (2006.01) | |

(52) U.S. Cl.
CPC ........... *B41J 2/161* (2013.01); *B41J 2/14233* (2013.01); *B41J 2/14274* (2013.01); *H01L 41/0475* (2013.01); *H01L 41/0973* (2013.01); *B41J 2002/14491* (2013.01); *B41J 2202/11* (2013.01)

(58) Field of Classification Search
CPC ........ B41J 2002/14491; H01L 41/0475; H01L 41/0973
See application file for complete search history.

(56) References Cited

U.S. PATENT DOCUMENTS

2011/0164093 A1* 7/2011 Kato et al. ...................... 347/68
2013/0265371 A1* 10/2013 Yazaki ................. B41J 2/14274

FOREIGN PATENT DOCUMENTS

JP 2015-104911 A 6/2015

\* cited by examiner

*Primary Examiner* — Juanita D Jackson
(74) *Attorney, Agent, or Firm* — Harness, Dickey & Pierce, P.L.C.

(57) ABSTRACT

A liquid discharge head includes: a pressure chamber communicating with a nozzle through which liquid is discharged; a piezoelectric element having a lamination structure in which a first electrode, a piezoelectric body layer, and a second electrode are laminated in this order; a vibration plate installed between the first electrode of the piezoelectric element and the pressure chamber; a protective substrate in which an internal space for housing the piezoelectric element is formed; and a lead-out wiring connected to the second electrode, in which a column portion is provided at a position overlapping with the piezoelectric element in the internal space of the protective substrate when viewed in a plan view, and the lead-out wiring is provided on a wall surface of the column portion.

15 Claims, 7 Drawing Sheets

LIQUID DISCHARGE HEAD, LIQUID DISCHARGE APPARATUS, AND PIEZOELECTRIC DEVICE

The entire disclosure of Japanese Patent Application No. 2018-050758, filed Mar. 19, 2018 is expressly incorporated by reference herein.

BACKGROUND

1. Technical Field

The present invention relates to a technique for discharging liquid such as ink or the like.

2. Related Art

An existing liquid discharge head that, by causing a piezoelectric element to vibrate a vibration plate configuring a wall surface of a pressure chamber, discharges liquid in the pressure chamber through a nozzle has been proposed. For example, JP-A-2015-104911 discloses a head in which a piezoelectric element having a lamination structure in which a piezoelectric body layer is interposed between a first electrode (lower electrode) and a second electrode (upper electrode) is installed in an internal space of a protective substrate. A lead-out wiring (lead-out electrode layer) of the second electrode is formed on an upper surface of the first electrode projecting to one end portion side of the piezoelectric element of a long shape. The lead-out wiring is led out from the piezoelectric element via the upper surface of the first electrode, and a driving signal is supplied to the second electrode through the lead-out wiring.

As disclosed in JP-A-2015-104911, in a configuration in which the lead-out wiring of the second electrode is led out via the upper surface of the first electrode, it is necessary to insulate the lead-out wiring and the first electrode from each other so as to prevent leakage by providing an insulating layer between the lead-out wiring and the first electrode. However, in the configuration of JP-A-2015-104911 as described above, as a thickness of the insulating layer between the lead-out wiring and the first electrode increases, an insulation property between the lead-out wiring and the first electrode can be enhanced, but a vibration plate becomes hard to move, and therefore a displacement amount of the vibration plate reduces. On the other hand, as the thickness of the insulating layer decreases, reduction in the displacement amount of the vibration plate can be suppressed, but there is a problem that the leakage between the lead-out wiring and the first electrode is easy to occur.

SUMMARY

A liquid discharge head according to an aspect of the invention includes: a pressure chamber communicating with a nozzle through which liquid is discharged; a piezoelectric element having a lamination structure in which a first electrode, a piezoelectric body layer, and a second electrode are laminated in this order; a vibration plate installed between the first electrode of the piezoelectric element and the pressure chamber; a protective substrate in which an internal space for housing the piezoelectric element is formed; and a lead-out wiring connected to the second electrode, in which a column portion is provided at a position overlapping with the piezoelectric element in the internal space of the protective substrate when viewed in a plan view, and the lead-out wiring is provided on a wall surface of the column portion.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
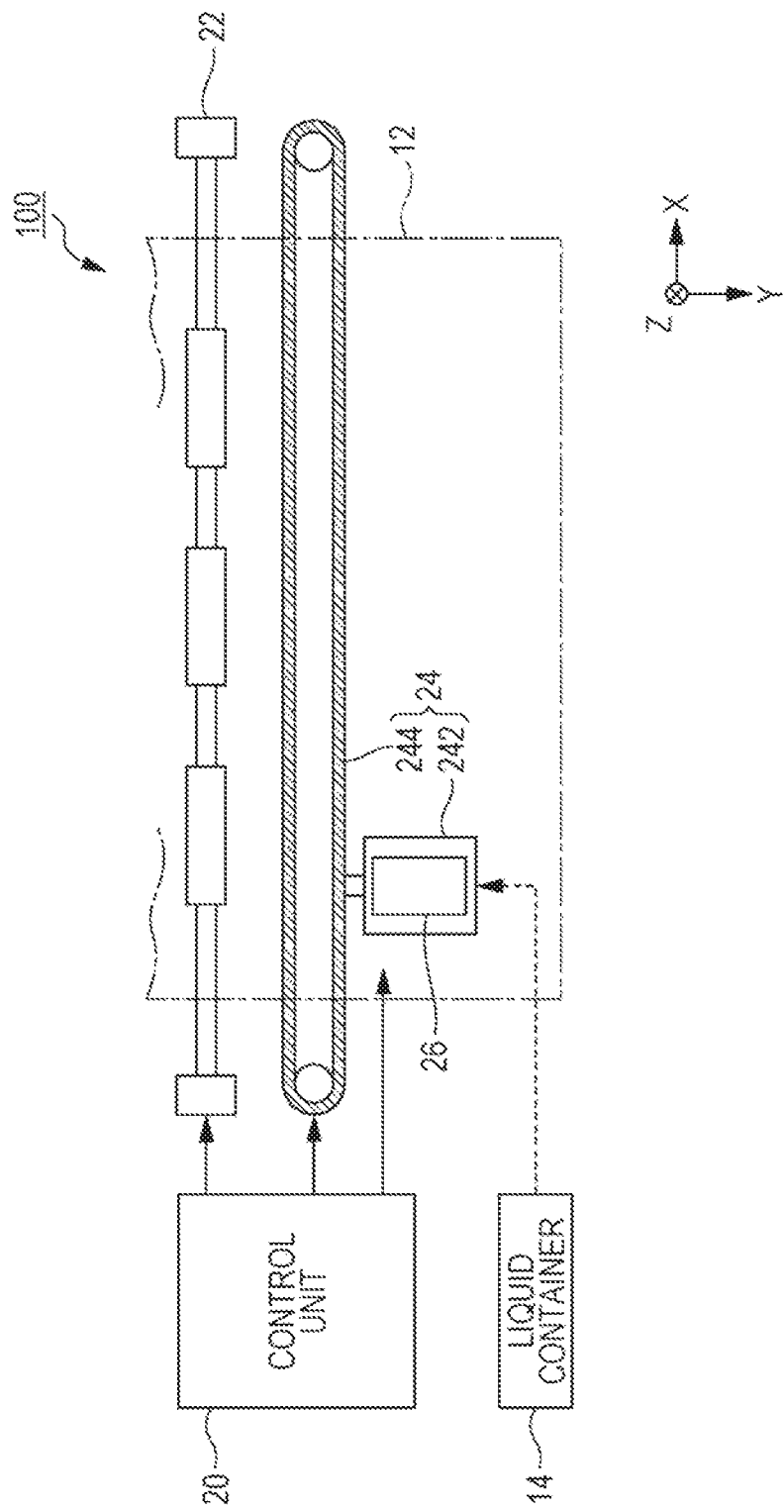
FIG. 1 is a configuration diagram of a liquid discharge apparatus according to a first embodiment of the invention.

FIG. 1 is a partial configuration diagram of a liquid discharge apparatus 100 according to a first embodiment of the invention. The liquid discharge apparatus 100 of the first embodiment is an ink jet type printing apparatus which discharges ink as an example of liquid to a medium 12 such as printing paper or the like. Although, typically, the medium is the printing paper, a target of printing made of an arbitrary material such as a resin film, a fabric, or the like can also be used as the medium 12. The liquid discharge apparatus 100 illustrated in FIG. 1 includes a control unit 20, a transport mechanism 22, a moving mechanism 24, and a liquid discharge head 26. A liquid container 14 for storing the ink is attached to the liquid discharge apparatus 100.

The liquid container 14 is an ink tank type cartridge formed of a box-shaped container which is attachable/detachable to/from a main body of the liquid discharge apparatus 100. Note that the liquid container 14 is not limited to the box-shaped container, may be an ink pack type cartridge formed from a bag-shaped container. Alternatively, an ink tank that can be replenished with the ink can also be used as the liquid container 14. The ink is stored in the liquid container 14. The ink may be a dye ink including dye as a color material, or may be a pigment ink including pigment as a color material. Additionally, the ink may be a black ink, or may be a color ink. The ink stored in the liquid container 14 is sent by pressure to the liquid discharge head 26 using a pump (not illustrated).

The control unit 20 includes, for example, a processing circuit such as a CPU (Central Processing Unit), an FPGA (Field Programmable Gate Array), or the like, and a storage circuit such as a semiconductor memory or the like, and generally controls each element of the liquid discharge apparatus 100. The transport mechanism 22 transports the medium 12 in a Y direction under the control of the control unit 20.

The moving mechanism 24 reciprocates the liquid discharge head 26 in an X direction under the control of the control unit 20. The X direction is a direction which intersects with (typically, is orthogonal to) the Y direction in which the medium 12 is transported. The moving mechanism 24 of the first embodiment includes a substantially box-shaped carriage 242 (transport body) for housing the liquid discharge head 26, and a transport belt 244 to which the carriage 242 is fixed. Note that a configuration in which a plurality of the liquid discharge heads 26 is mounted on the carriage 242, or a configuration in which the liquid container 14 is mounted on the carriage 242 with the liquid discharge head 26 may also be used.

The liquid discharge head 26 discharges the ink supplied from the liquid container 14 onto the medium 12 through a plurality of nozzles N (discharge holes) under the control of the control unit 20. By the liquid discharge head 26 discharging the ink onto the medium 12 in parallel with the transport of the medium 12 by the transport mechanism 22 and the iterative reciprocation of the carriage 242, a desired image is formed on a surface of the medium 12. Note that a direction perpendicular to an X-Y plane (for example, a plane parallel to the surface of the medium 12) is expressed below as a Z direction. A discharge direction of the ink by the liquid discharge head 26 (typically, a vertical direction) corresponds to the Z direction.

Liquid Discharge Head

Figure 2:
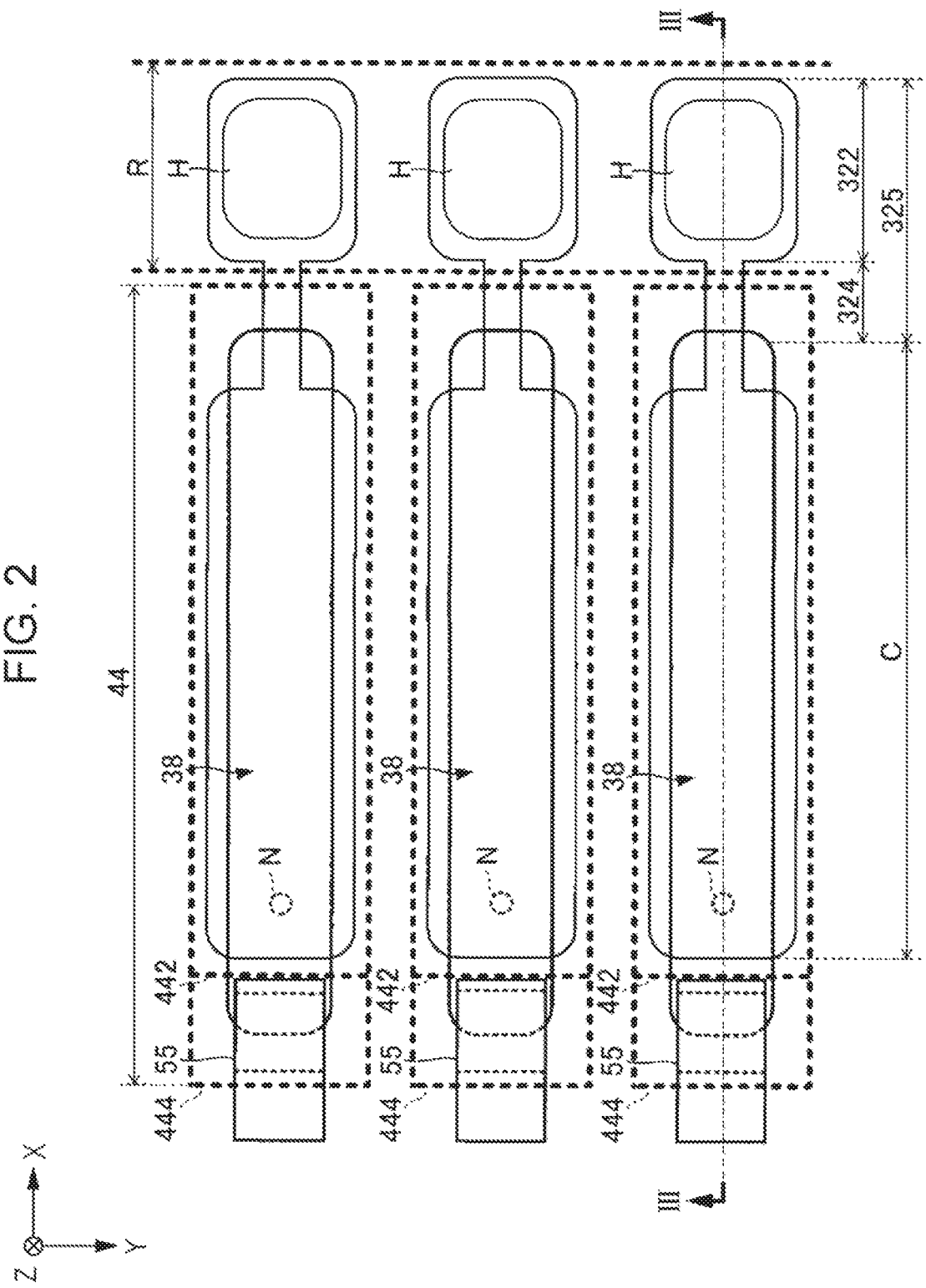
FIG. 2 is a plan view of a liquid discharge head.
Figure 3:
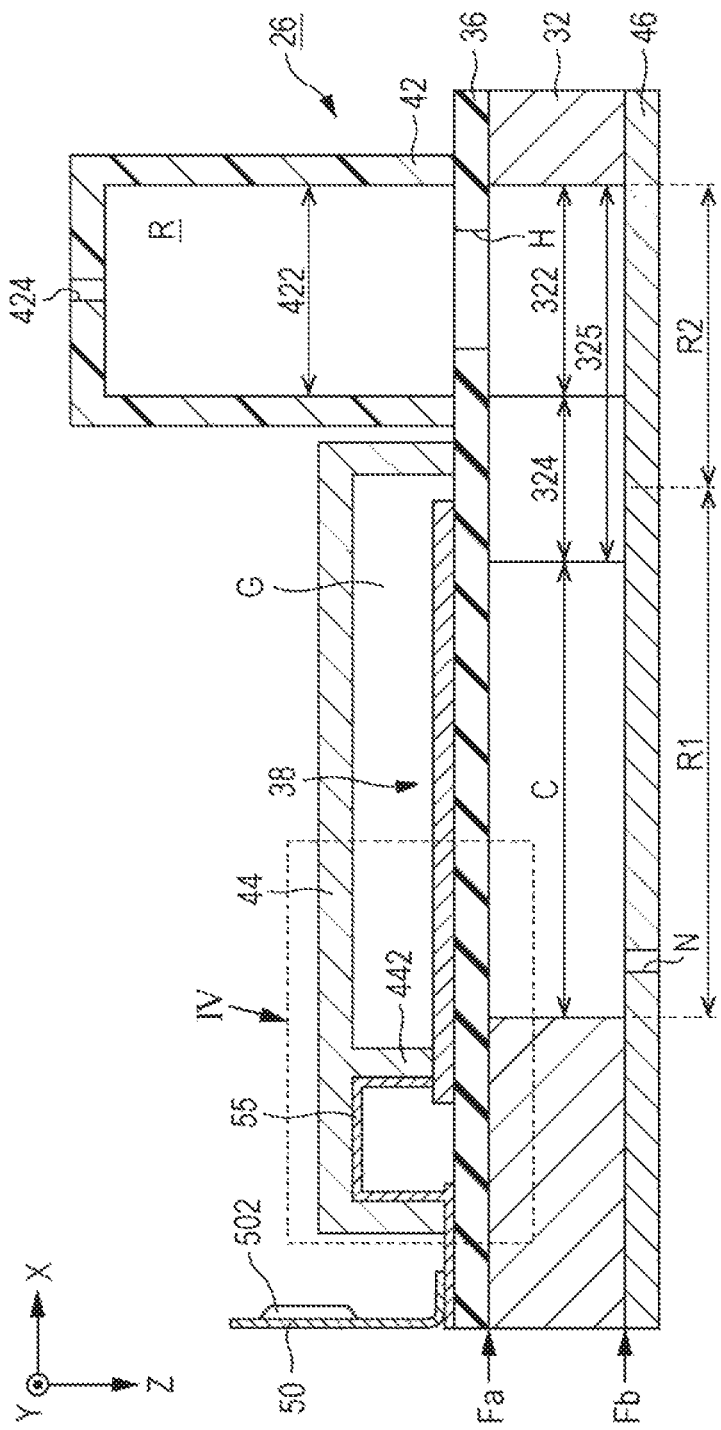
FIG. 3 is a cross-sectional view of the liquid discharge head taken by cutting along a III-III cross-section in FIG. 2.

FIG. 2 is a plan view of the liquid discharge head 26 viewed from the Z direction, and FIG. 3 is a cross-sectional view of the liquid discharge head 26 in a case of being cut along a III-III cross-section illustrated in FIG. 2. In FIG. 2, a protective substrate 44 and a housing portion 42 are illustrated by dotted lines, and a connection wiring substrate 50 is omitted. As illustrated in FIG. 2 and FIG. 3, the liquid discharge head 26 includes a nozzle plate 46, a flow path substrate 32, a vibration plate 36, a piezoelectric device 38 including a piezoelectric element P, the protective substrate 44, and the housing portion 42.

As illustrated in FIG. 3, on a surface Fa of the flow path substrate 32 on a negative side in the Z direction, the vibration plate 36, a plurality of the piezoelectric devices 38, the housing portion 42, and the protective substrate 44 are installed. On the other hand, on a surface Fb of the flow path substrate 32 on a positive side in the Z direction, the nozzle plate 46 is installed. Each element of the liquid discharge head 26 is a plate-shaped member that is schematically long in the Y direction, and for example, bonded to one another with an adhesive.

The nozzle plate 46 is a plate-shaped member in which the plurality of nozzles N arrayed in the Y direction is formed. Each of the nozzles N is a through-hole through which the ink passes. Note that the flow path substrate 32 and the nozzle plate 46 are formed, for example, by processing a silicon (Si) single-crystal substrate through a semiconductor manufacturing technique such as etching or the like. Note that any materials, any manufacturing methods, or the like may be employed for each element of the liquid discharge head 26. The Y direction of the embodiment is also a direction in which the plurality of nozzles N is arrayed.

The flow path substrate 32 is a plate-shaped member for forming a flow path of the ink. As illustrated in FIG. 2 and FIG. 3, a pressure chamber C (cavity), an opening portion 322, and a supply flow path 324 are formed in the flow path substrate 32 for each of the nozzles N. The supply flow path 324 is located between the pressure chamber C and the opening portion 322. Each of the pressure chamber C and the supply flow path 324 is a long space along the X direction when viewed in a plan view (when viewed from the Z direction). In a plan view, a length of the opening portion 322 (a dimension in the X direction) is shorter than a length of the pressure chamber C (a dimension in the X direction).

The supply flow path 324 is a throttle flow path whose flow path width is further narrowed than that of the pressure chamber C. By making the supply flow path 324 be the throttle flow path, a predetermined flow path resistance is added. In the embodiment, in a plan view as illustrated in FIG. 2, a case in which a width of the supply flow path 324 (a dimension in the Y direction) is smaller than a width of the pressure chamber C (a dimension in the X direction), and the supply flow path 324 is configured by the throttle flow path narrower than a width of the opening portion 322 is described as an example. The pressure chamber C communicates with the nozzle N, the opening portion 322 communicates with the pressure chamber C through the supply flow path 324. Note that any shape is employed for the pressure chamber C, the opening portion 322, and the supply flow path 324 that are respective elements of the flow path substrate 32.

Each of the pressure chamber C, the opening portion 322, and the supply flow path 324 is configured of an opening that is formed so as to pass through the flow path substrate 32 from the surface Fa to the surface Fb on an opposite side. Of each of these openings, the surface Fa side of the flow path substrate 32 is closed by the vibration plate 36, and the surface Fb side of the flow path substrate 32 is closed by the nozzle plate 46.

The vibration plate 36 of the embodiment overlaps with the pressure chamber C, the supply flow path 324, and the opening portion 322 in a plan view. The vibration plate 36 is an elastically deformable plate-shaped member. FIG. 3 illustrates a case where the vibration plate 36 is configured of one layer as an example. The vibration plate 36 is, for example, configured by silicon oxide ($SiO_2$). Note that the vibration plate 36 may be configured of a plurality of layers. In a case where the vibration plate 36 is configured of the plurality of layers, for example, the vibration plate is configured of a first layer on the pressure chamber C side and a second layer which is laminated on an opposite side from the pressure chamber C when viewed from the first layer. The first layer is made of an elastic film formed of an elastic material such as silicon oxide ($SiO_2$) or the like, and the second layer is made of an insulating film formed of an insulating material such as zirconium oxide ($ZrO_2$) or the like. Note that by partially selectively removing a region, in a plate thickness direction, which corresponds to the pressure chamber C, of the plate-shaped member having a predetermined plate thickness, it is also possible to integrally form a part or all of the flow path substrate 32 and the vibration plate 36.

The vibration plate 36 and the nozzle plate 46 of the embodiment face to each other with a gap in the inside of each of the pressure chambers C. The pressure chamber C is located between the vibration plate 36 and the nozzle plate 46, and is a space for applying pressure to the ink with which the pressure chamber C is filled.

The housing portion 42 is installed on the vibration plate 36 on an opposite side from the opening portion 322. The housing portion 42 is, for example, a structural body manufactured through resin material injection molding, and is fixed on a surface of the vibration plate 36 on the negative side in the Z direction. A liquid storage chamber R is formed in the housing portion 42. The liquid storage chamber R is a common liquid chamber for storing the ink supplied from the liquid container 14 and supplying the liquid to the plurality of pressure chambers C. The liquid storage chamber R extends in the Y direction across the plurality of pressure chambers C arrayed in the Y direction. As illustrated in FIG. 2, the liquid storage chamber R overlaps with the plurality of opening portions 322 when viewed in a plan view.

As illustrated in FIG. 2 and FIG. 3, a through-hole H is formed in a portion of the vibration plate 36 overlapping with the opening portion 322. The through-hole H enables the liquid storage chamber R and the opening portion 322 to communicate with each other. The ink stored in the liquid storage chamber R passes through the through-hole H and is supplied to the opening portion 322. Note that although the embodiment describes a case where one through-hole H is formed as an example, the configuration is not limited thereto, a plurality of the through-holes H may be formed. Additionally, a filter in which the plurality of through-holes H is formed may be installed in the portion of the vibration plate 36 overlapping with the opening portion 322. In a case where the filter as described above is installed, by making a diameter of each of the plurality of through-holes H of the filter smaller than a diameter of the nozzle N, for example, bubbles, foreign substances, or the like included in the ink can be easily captured by the filter.

The opening portion 322 is a space for supplying the ink to the pressure chamber C, and stores the ink supplied from the liquid storage chamber R. The ink stored in the opening portion 322 is supplied to the pressure chamber C through the supply flow path 324. The supply flow path 324 is a space for ensuring the flow path resistance, and functions as a flow path for causing the ink to flow from the opening portion 322 to the pressure chamber C. The opening portion 322 and the supply flow path 324 function as a liquid supply chamber 325 for supplying the ink to the pressure chamber C. The liquid supply chamber 325 communicates with the pressure chamber C. The ink stored in the liquid storage chamber R is supplied, through each of the liquid supply chambers 325, to the plurality of pressure chambers C and the pressure chambers are filled with the ink, in parallel.

As described above, the vibration plate 36 is installed on the flow path substrate 32, and overlaps with the pressure chamber C and the liquid supply chamber 325 (the supply flow path 324 and the opening portion 322). Accordingly, in the following description, a portion of the vibration plate 36 overlapping with the pressure chamber C is expressed as a "vibration portion R1", and a portion of the vibration plate 36 overlapping with the liquid supply chamber 325 is expressed as a "fixed portion R2". The piezoelectric device 38 is installed in the vibration portion R1, and the through-hole H is formed in the fixed portion R2 (specifically, in a portion overlapping with the opening portion 322). The vibration portion R1 of the vibration plate 36 configures a wall surface (upper surface) of the pressure chamber C on the negative side in the Z direction, and is a portion which deforms by the piezoelectric device 38 being driven. The fixed portion R2 of the vibration plate 36 is a portion which is fixed to the surface Fa of the flow path substrate 32.

On a surface of the vibration plate 36 in the vibration portion R1 on an opposite side from the pressure chamber C (a surface on the negative side in the Z direction), the plurality of piezoelectric devices 38 corresponding to different nozzles N (or pressure chambers C) is installed. Each of the piezoelectric devices 38 is an actuator which deforms by a driving signal being supplied, and is long in the X direction. The plurality of piezoelectric devices 38 is arrayed in the Y direction so as to correspond to the plurality of pressure chambers C, respectively. When the vibration plate 36 vibrates in conjunction with the deformation of the piezoelectric device 38, by variation in the pressure in the pressure chamber C, the ink with which the pressure chamber C is filled passes through a communication flow path 326 and the nozzle N to be discharged.

The protective substrate 44 illustrated in FIG. 2 and FIG. 3 is a structural body for protecting the plurality of piezoelectric devices 38 and reinforcing a mechanical strength of the flow path substrate 32 and the vibration plate 36, and is fixed on a surface of the vibration plate 36 with an adhesive, for example. The plurality of piezoelectric devices 38 is housed in an internal space G surrounded by a recessed portion of the protective substrate 44 formed on a surface facing the vibration plate 36 and the surface of the vibration plate 36.

As illustrated in FIG. 3, on the surface of the vibration plate 36 (or the surface of the flow path substrate 32), for example, the connection wiring substrate 50 is bonded. Specifically, the connection wiring substrate 50 is electrically connected to a lead-out wiring 55 led out from the piezoelectric device 38. The lead-out wiring 55 is a conductive layer, and is individually formed for each of the piezoelectric devices 38 (or for each of the pressure chambers C).

The connection wiring substrate 50 is a mounted component in which a plurality of wirings (not illustrated) for electrically connecting the control unit 20 or a power source circuit (not illustrated) and the liquid discharge head 26 to each other is formed. For example, the connection wiring substrate 50 with flexibility such as an FPC (Flexible Printed Circuit), an FFC (Flexible Flat Cable), or the like is preferably employed. On the connection wiring substrate 50, a driving circuit 502 for driving the plurality of piezoelectric devices 38 is mounted. The driving circuit 502 is electrically connected to the control unit 20. The driving circuit 502 generates a driving signal (voltage signal) which is supplied to the plurality of piezoelectric devices 38 under the control by the control unit 20.

Figure 4:
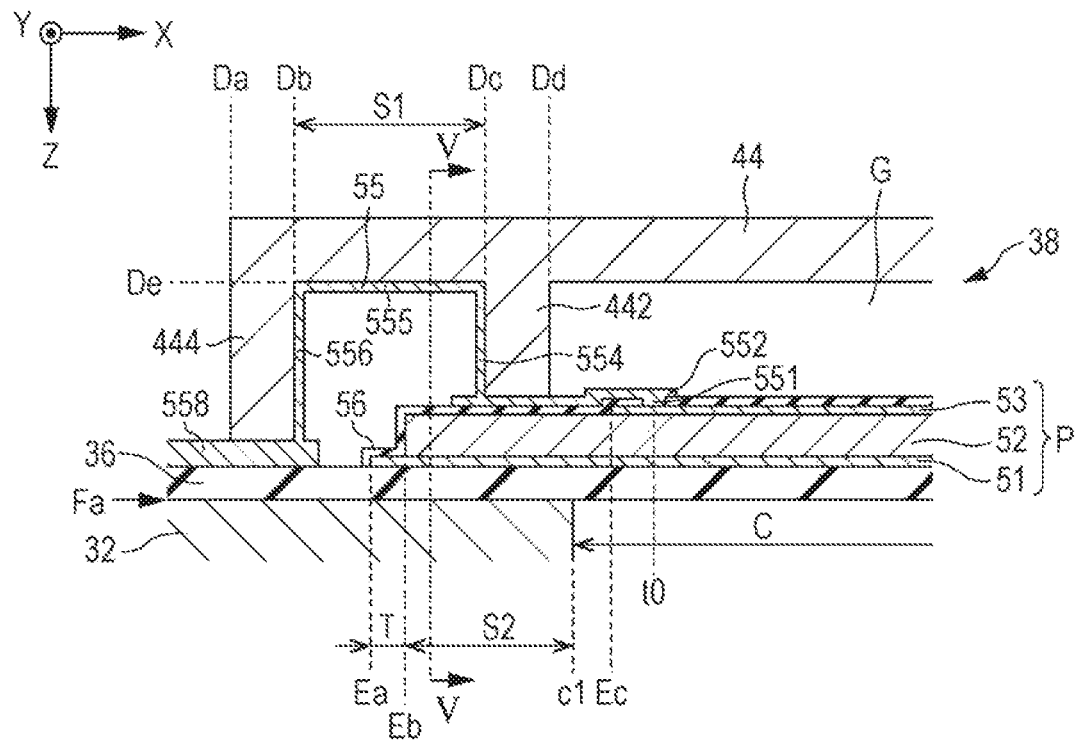
FIG. 4 is a cross-sectional view partially illustrating a configuration of a piezoelectric device.

As illustrated in FIG. 4 which will be described later, each of the piezoelectric devices 38 includes the piezoelectric element P in which a first electrode 51, a piezoelectric body layer 52, and a second electrode 53 are laminated, the driving signal from the driving circuit 502 is applied to each of the second electrodes 53 through the connection wiring substrate 50 and the lead-out wiring 55. Additionally, a common reference voltage from the driving circuit 502 is applied to the first electrode 51 through the connection wiring substrate 50 and a lead-out wiring (not illustrated). With this configuration, by the piezoelectric device 38 deforming in accordance with a potential difference between a voltage of the driving signal and the common reference voltage, it is possible to vibrate the vibration plate 36. Note that although the embodiment describes a case where the driving circuit 502 is electrically connected to the piezoelectric device 38 with the connection wiring substrate 50 interposed therebetween as an example, the configuration is not limited thereto, for example, the configuration may be such that a driving IC in which the driving circuit 502 is configured of a substantially rectangular IC chip is laminated on the protective substrate 44, and the lead-out wiring 55 is electrically connected to the driving IC.

Piezoelectric Device

Figure 5:
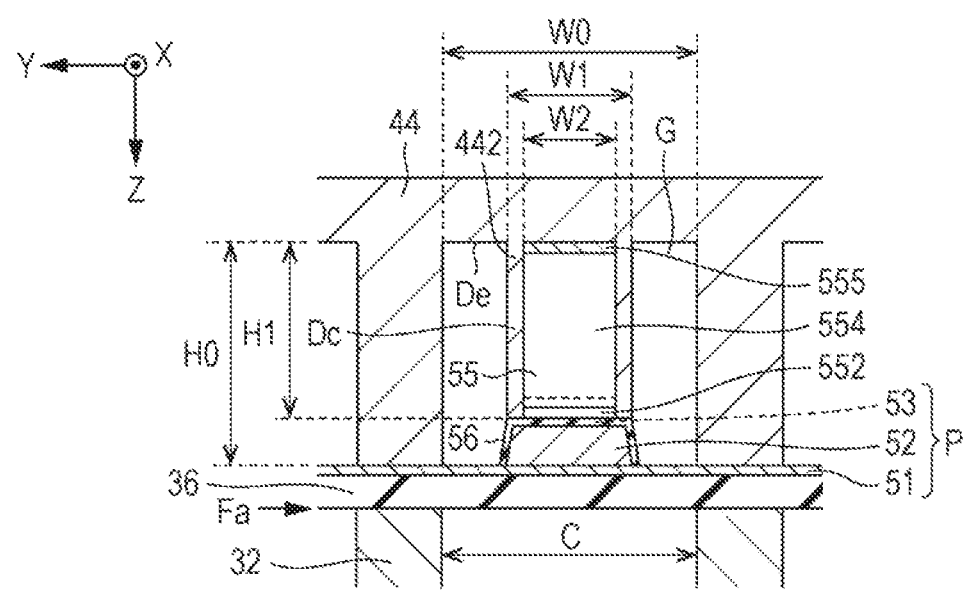
FIG. 5 is a cross-sectional view of the piezoelectric device taken by cutting along a V-V cross-section in FIG. 4.

A specific configuration of the piezoelectric device 38 will be described in detail below. FIG. 4 is a cross-sectional view partially illustrating the configuration of one arbitrary piezoelectric device 38, and is an enlarged view of a IV portion illustrated in FIG. 3. FIG. 5 is a cross-sectional view of the piezoelectric device 38 in a case of being cut along a V-V cross-section illustrated in FIG. 4. As illustrated in FIG. 4, the piezoelectric device 38 includes the piezoelectric element P and the lead-out wiring 55.

The piezoelectric element P is a laminated body having a lamination structure in which the first electrode 51, the piezoelectric body layer 52, and the second electrode 53 are laminated in this order. On the surface of the vibration plate 36 on the opposite side from the pressure chamber C, the first electrode 51, the piezoelectric body layer 52, and the second electrode 53 are laminated in the Z direction. As described above, the Z direction of the embodiment is also a direction in which a plurality of layers configuring the piezoelectric element P is laminated. Note that in the specification, an expression "an element A and an element B are laminated" is not limited to a configuration in which the element A and the element B are in direct contact with each other. In other words, a configuration in which another element C is interposed between the element A and the element B is also included in a concept of "the element A and the element B are laminated".

The piezoelectric element P is individually formed for each of the pressure chambers C (or for each of the nozzles N). Specifically, a plurality of the piezoelectric elements P which is long in the X direction is arrayed in the Y direction with intervals therebetween. A portion of the piezoelectric body layer 52 in which a piezoelectric strain occurs by being sandwiched between the first electrode 51 and the second electrode 53 (hereinafter, referred to as an "active portion") deforms in accordance with a voltage difference between the reference voltage applied to the first electrode 51 and the driving signal supplied to the second electrode 53. Note that in the following description, a portion in which the piezoelectric body layer 52 or the second electrode 53 is not laminated on the first electrode 51 is referred to as an "inactive portion".

The first electrode 51 of the piezoelectric element P is formed on the surface of the vibration plate 36 on the negative side in the Z direction. Specifically, the first electrode 51 is a band-shaped common electrode extending in the Y direction so as to be continuous across the plurality of piezoelectric devices 38 (or the plurality of pressure chambers C). A predetermined reference voltage is applied to an end portion (not illustrated) of the first electrode 51 in the Y direction from the connection wiring substrate 50, for example.

The piezoelectric body layer 52 is formed on a surface of the first electrode 51 on an opposite side from the vibration plate 36. The piezoelectric body layer 52 is individually formed for each of the piezoelectric devices 38 (or for each of the pressure chambers C), and overlaps with the pressure chamber C when viewed in a plan view. In other words, a plurality of the piezoelectric body layers 52 which is long in the X direction is arrayed in the Y direction with intervals therebetween. Any materials or manufacturing methods is employed for the piezoelectric body layer 52. For example, by forming a thin film made of a piezoelectric material such as lead zirconate titanate or the like through a known film formation technique such as sputtering or the like, and selectively removing the thin film through a known processing technique such as photolithography or the like, the piezoelectric body layer 52 can be formed.

The second electrode 53 is laminated on the piezoelectric body layer 52. The second electrode 53 is an individual electrode which is individually formed for each of the piezoelectric devices 38 (or for each of the pressure chambers C). Specifically, a plurality of the second electrodes 53 extending in the X direction is arrayed in the Y direction with intervals therebetween. Any materials or manufacturing methods is employed for the second electrode 53. For example, by forming a thin film made of a conductive material such as platinum, iridium, or the like through a known film formation technique such as sputtering or the like, and selectively removing the thin film through a known processing technique such as photolithography or the like, the second electrode 53 can be formed.

In the piezoelectric element P of the embodiment, lengths of the first electrode 51, the piezoelectric body layer 52, and the second electrode 53 in the X direction are different from one another. The length of the first electrode 51 in the X direction is the longest, and the lengths decrease in the order of the piezoelectric body layer 52, the second electrode 53. Accordingly, there is the inactive portion on an end portion of the piezoelectric element P of the embodiment in the X direction. Specifically, an end portion Eb of the piezoelectric body layer 52 on a negative side in the X direction is located on the negative side in the X direction when viewed from an end portion Ec of the second electrode 53 on the negative side in the X direction. Accordingly, a region from the end portion Eb of the piezoelectric body layer 52 to the end portion Ec of the second electrode 53 is a region in which the piezoelectric body layer 52 projects without the second electrode 53, and therefore is the inactive portion. Additionally, an end portion Ea of the first electrode 51 on the negative side in the X direction is located on the negative side in the X direction when viewed from the end portion Eb of the piezoelectric body layer 52 on the negative side in the X direction. Accordingly, a region from the end portion Ea of the first electrode 51 to the end portion Eb of the piezoelectric body layer 52 is a region in which the first electrode 51 projects without the second electrode 53 and the piezoelectric body layer 52, and therefore is the inactive portion.

The lead-out wiring 55 of the first embodiment is led out from the piezoelectric element P to the negative side in the Z direction, and routed to the outside of the protective substrate 44 via wall surfaces of the internal space G of the protective substrate 44. The lead-out wiring 55 of the embodiment is a lead-out wiring of the second electrode 53 configuring the piezoelectric element P which will be described later. Although the first electrode 51 configuring the piezoelectric element P is also connected to the connection wiring substrate 50 with a lead-out wiring, the lead-out wiring of the first electrode 51 is not illustrated.

As illustrated in FIG. 4 and FIG. 5, the protective substrate 44 of the embodiment is provided with a column portion 442 at a position overlapping with the piezoelectric element P when viewed in a plan view (viewed from the Z direction). The column portion 442 of the embodiment has a rectangular cross-section along the X-Y plane. Note that the cross-section of the column portion 442 is not limited to a case of the rectangle, may have a circular or elliptical shape. In other words, the shape may be a prism shape, or may be a cylindrical shape. As illustrated in FIG. 5, the column portion 442 is individually formed for each of the plurality of piezoelectric elements P. Note that the column portion 442 may be formed across the plurality of piezoelectric elements P.

The column portion 442 of the embodiment extends from a wall surface on the negative side in the Z direction among the wall surfaces configuring the internal space G of the protective substrate 44 to an upper surface of the piezoelectric element P along the Z direction. Note that the column portion 442 may include a portion which is slanted relative to the Z direction.

As illustrated in FIG. 4, the column portion 442 of the embodiment is located between the end portion Ec of the second electrode 53 on the negative side in the X direction and the end portion Eb of the piezoelectric body layer 52 on the negative side in the X direction when viewed in a plan view, that is, in a region where the piezoelectric body layer 52 projects from the end portion Ec of the second electrode 53 toward the negative side in the X direction. Specifically, a wall surface Dc on the negative side in the X direction and a wall surface Dd on a positive side in the X direction of the column portion 442 are located between the end portion Ec of the second electrode 53 and the end portion Eb of the piezoelectric body layer 52 when viewed in a plan view.

As illustrated in FIG. 4 and FIG. 5, the lead-out wiring 55 is provided along the wall surface Dc of the column portion 442, and connected to the second electrode 53. Accordingly, the lead-out wiring 55 is led out from the second electrode 53 to the negative side in the Z direction along the wall surface Dc of the column portion 442. According to the configuration as described above, the lead-out wiring 55 of the second electrode 53 can be led out without passing on an upper surface of the first electrode 51.

Figure 6:
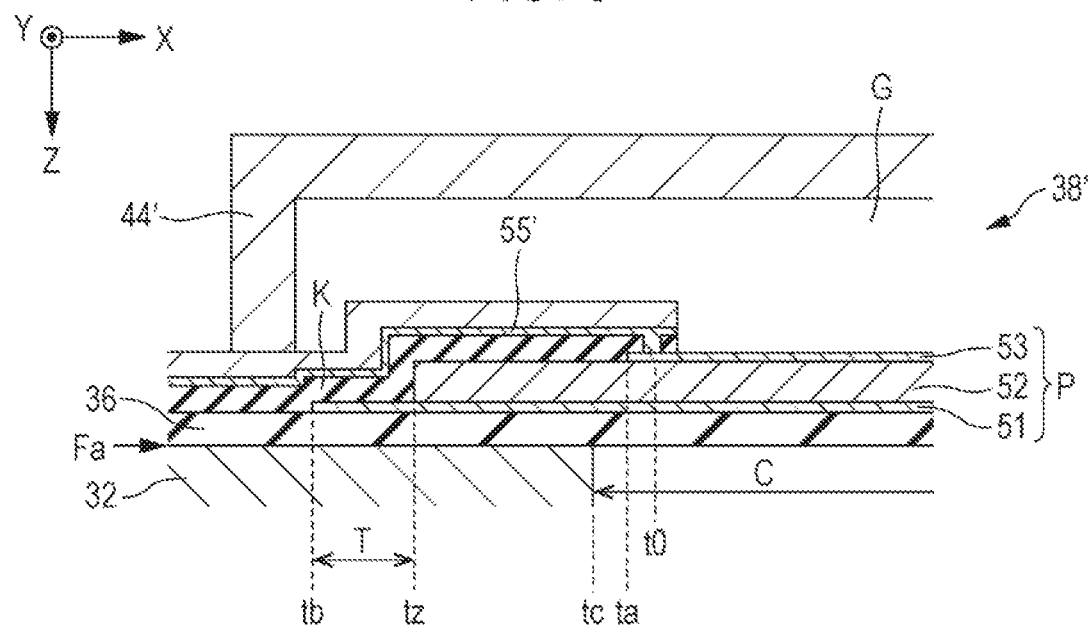
FIG. 6 is a cross-sectional view illustrating a configuration of a piezoelectric device according to a comparative example.

FIG. 6 is a cross-sectional view illustrating a configuration of a piezoelectric device 38' according to a comparative example. In FIG. 6, although the configuration of the piezoelectric element P is the same as that of the embodiment, configurations of a protective substrate 44' and a lead-out wiring 55' of the second electrode 53 are different. In FIG. 6, in a region T where the first electrode 51 projects to the negative side in the X direction from an end portion Eb of the piezoelectric body layer 52, the lead-out wiring 55' of the second electrode 53 is led out to the outside of the protective substrate 44' via the upper surface of the first electrode 51. As illustrated in the comparative example in FIG. 6, in a configuration in which the lead-out wiring 55' of the second electrode 53 is led out via the upper surface of the first electrode 51, it is necessary to insulate the lead-out wiring 55' of the second electrode 53 and the first electrode 51 from each other so as to prevent leakage by providing an insulating layer K between the lead-out wiring 55' of the second electrode 53 and the first electrode 51.

However, in such a configuration of the comparative example, as a thickness of the insulating layer K between the lead-out wiring 55' of the second electrode 53 and the first electrode 51 increases, an insulation property between the lead-out wiring 55' of the second electrode 53 and the first electrode 51 can be enhanced, but the vibration plate 36 becomes hard to move, and therefore a displacement amount of the vibration plate 36 reduces. On the other hand, as the thickness of the insulating layer K decreases, reduction in the displacement amount of the vibration plate 36 can be suppressed, but there is a problem that the leakage between the lead-out wiring 55' of the second electrode 53 and the first electrode 51 is easy to occur. In the configuration in FIG. 6, since the lead-out wiring 55' and the first electrode 51 are closest to each other in the region T where the end portion Ea of the first electrode 51 projects to the negative side in the X direction from the end portion Eb of the piezoelectric body layer 52, the leakage occurs with ease in the region T.

In this respect, according to the first embodiment, by providing the lead-out wiring 55 of the second electrode 53 on the wall surface Dc of the column portion 442 provided in the internal space G of the protective substrate 44, the lead-out wiring 55 of the second electrode 53 can be led out without passing on the upper surface of the first electrode 51. Accordingly, even without the insulating layer for insulating the lead-out wiring 55 of the second electrode 53 from the first electrode 51, the insulation property between the lead-out wiring 55 of the second electrode 53 and the first electrode 51 can be ensured. Additionally, reduction in the displacement amount of the vibration plate 36 caused by the vibration plate 36 being hard to move due to the thickness of the insulating layer can be suppressed. As described above, according to the embodiment, while ensuring the insulation property between the electrodes 51 and 53 of the piezoelectric element P, the displacement amount of the vibration plate 36 can be ensured.

As described above, since the lead-out wiring 55 of the embodiment is led out to the Z direction intersecting with the X direction in which the piezoelectric element P extends by the wall surface Dc of the column portion 442 of the protective substrate 44, in comparison with a case where the lead-out wiring 55 is led out so as to be overlapped with the first electrode 51 as in the comparative example in FIG. 6, parasitic capacitance between the lead-out wiring 55 and the first electrode 51 can be extremely reduced. Accordingly, power consumption can be suppressed. Additionally, since a load of the driving circuit 502 can be reduced, occurrence of electric crosstalk in which a waveform of the driving signal of the piezoelectric element P deteriorates (for example, overshoot or the like) can be reduced.

The lead-out wiring 55 of the embodiment is configured of a plurality of wirings 552, 554, 555, 556, and 558 which is electrically connected to one another. The wiring 552 is a wiring for connecting to the second electrode 53, and extends from a position overlapping with the second electrode 53 to a position overlapping with the column portion 442, when viewed in a plan view, along the X direction. For example, as illustrated in FIG. 4, in a case where the wiring 552 is formed on a protective film 56 which is formed on surfaces of the piezoelectric body layer 52 and the second electrode 53, the wiring 552 is connected to the second electrode 53 by a connection terminal 551 formed in a through-hole H (contact hole) passing through the protective film 56. A portion where the connection terminal 551 and the second electrode 53 are in contact with each other serves as an electric connection point t0 between the second electrode 53 and the lead-out wiring 55. Note that in a case where the protective film 56 is not formed, the wiring 552 may be connected to the second electrode 53 with the connection terminal 551 having a projection shape.

The wiring 554 extends in the Z direction along the wall surface Dc of the column portion 442 on the negative side in the X direction. The wiring 552 is connected to an end portion of the wiring 554 on the positive side in the Z direction and the wiring 555 is connected to an end portion of the wiring 554 on the negative side in the Z direction. The wiring 555 is formed, in the X direction, along a wall surface De (upper surface) among the wall surfaces of the internal space G of the protective substrate 44 on the negative side in the Z direction, and connected to the wiring 556. The wiring 556 is formed, in the Z direction, along a wall surface Db (side surface) among the wall surfaces of the internal space G of the protective substrate 44 on the positive side in the X direction.

The wiring 558 is installed between a wall portion 444 of the protective substrate 44 on the negative side in the X direction and the vibration plate 36. The wiring 558 extends from a position on an inner side of the inner wall surface Db of the wall portion 444 to a position on an outer side of an outer wall surface Da of the wall portion when viewed in a plan view. The wiring 558 is connected to the wiring 556 on the inner wall surface Db of the wall portion 444, and connected to the connection wiring substrate 50 illustrated in FIG. 3 on the outside of the wall portion 444.

According to the configuration as described above, the lead-out wiring 55 of the second electrode 53 is routed to the outside of the protective substrate 44 via the wall surfaces of the column portion 442 and the internal space G of the protective substrate 44. With this configuration, the insulating layer for insulating the lead-out wiring 55 of the second electrode 53 from the first electrode 51 can be made unnecessary. Specifically, as illustrated in FIG. 4, the lead-out wiring 55 is led out, in a region S1 from the wall surface Dc of the column portion 442 to the wall surface Db when viewed in a plan view, via the wall surface Dc of the column portion 442 and the wall surfaces De and Db of the internal space G. As described above, since the region T where the first electrode 51 projects from the piezoelectric body layer 52 is included in the region S1 where the lead-out wiring 55 is led out, when viewed in a plan view, the lead-out wiring 55 can be prevented from making contact with the region T of the first electrode 51. Accordingly, in the embodiment, the insulating layer for insulating the first electrode 51 and the lead-out wiring 55 of the second electrode 53 from each other is not required.

Note that as illustrated in FIG. 4, the protective film 56 may be formed on the surfaces of the first electrode 51, the piezoelectric body layer 52, and the second electrode 53 exposed to the air. The protective film 56 is configured of an insulating material. The protective film 56 is provided for protection against humidity or the like, for example, it is sufficient for the film to have a thickness to the extent that the elements do not make contact with the air, and it is not necessary to increase the thickness thereof to a thickness enough to insulate the first electrode 51 and the lead-out wiring 55 from each other. Accordingly, even in a case where the protective film 56 is formed, since the protective film 56 can be made extremely thin and does not disturb a movement of the vibration plate 36, the displacement amount of the vibration plate 36 can be sufficiently ensured.

Additionally, as illustrated in FIG. 5, in the internal space G in which one piezoelectric element P is installed, a width W2 of the wiring 554 of the lead-out wiring 55 (a dimension in the Y direction) is smaller than a width W1 of the wall surface Dc of the column portion 442 (a dimension in the Y direction). As described above, by making the width W2 of the lead-out wiring 55 smaller than the width W1 of the wall surface Dc of the column portion 442, it is possible to make it easy to form the wiring on the column portion 442. Note that the width W2 of the lead-out wiring 55 of the second electrode 53 may be made larger than the width W1 of the wall surface Dc of the column portion 442. By making the width W2 of the lead-out wiring 55 of the second electrode 53 larger than the width W1 of the wall surface Dc of the column portion 442, a wiring area increases, and thus a wiring resistance can be lowered.

Additionally, as illustrated in FIG. 5, although the embodiment describes a case where, in the internal space G in which one piezoelectric element P is installed, the width W1 of the wall surface Dc of the column portion 442 in the X direction is smaller than a width W0 of the internal space G in the X direction as an example, the width W1 of the column portion 442 in the X direction may be equivalent to the width W0 of the internal space G in the X direction. In other words, the column portion 442 may be formed across the plurality of piezoelectric elements P. By configuring as described above, strength of the protective substrate 44 can be improved. Additionally, although the embodiment describes a case where a height H1 of the wall surface Dc of the column portion 442 (a dimension in the Z direction) is lower than a height H0 of the wall surface in the Y direction (a dimension in the Z direction) as an example, the height H1 of the column portion 442 (the dimension in the Z direction) may be equivalent to the height H0 of the wall surface on the negative side in the Y direction (the dimension in the Z direction). For example, by installing another member between a side wall of the protective substrate 44 and the vibration plate 36, the height H0 of the side wall of the protective substrate 44 may be adjusted.

Additionally, the column portion 442 of the protective substrate 44 of the embodiment is located in a region not overlapping with the pressure chamber C when viewed in a plan view. Specifically, as illustrated in FIG. 4, the end portion Eb of the piezoelectric body layer 52 is located on the outside of the pressure chamber C relative to an end portion c1 of the pressure chamber C when viewed in a plan view, and the column portion 442 overlaps with a region S2 between the end portion Eb of the piezoelectric body layer 52 and the end portion c1 of the pressure chamber C when viewed in a plan view. In the region S2, since the pressure chamber C is not formed in the flow path substrate 32, the column portion 442 is less likely to be affected by vibration of the vibration plate 36. In other words, the column portion 442 is formed at a position distanced from a vibration region of the vibration plate 36 (a region where the vibration plate 36 overlaps with the pressure chamber C when viewed in a plan view). Accordingly, a close contact property of the column portion 442 with the piezoelectric element P can be improved. Additionally, since the pressure chamber C is not present in a region where the column portion 442 overlaps with the flow path substrate 32 (a region below the column portion 442) when viewed in a plan view, fixing strength of the protective substrate 44 can be ensured.

Additionally, as illustrated in FIG. 4, the electric connection point t0 between the connection terminal 551 of the lead-out wiring 55 of the second electrode 53 and the second electrode 53 overlaps with the pressure chamber C when viewed in a plan view. Accordingly, the end portion Ec of the second electrode 53 on the negative side in the X direction can be installed at a position overlapping with the pressure chamber C when viewed in a plan view. In other words, by making the connection point t0 to be installed in the inside of the pressure chamber C (the positive side in the X direction) relative to the end portion c1 of the pressure chamber C when viewed in a plan view, the end portion Ec of the second electrode 53 can be made to be installed in the inside of the pressure chamber C relative to the end portion c1 of the pressure chamber C. As described above, since a length of the second electrode 53 in the X direction can be decreased, electrostatic capacity of the piezoelectric element P can be reduced. Accordingly, this configuration also makes it possible to suppress the power consumption and reduce the occurrence of electric crosstalk.

Figure 7:
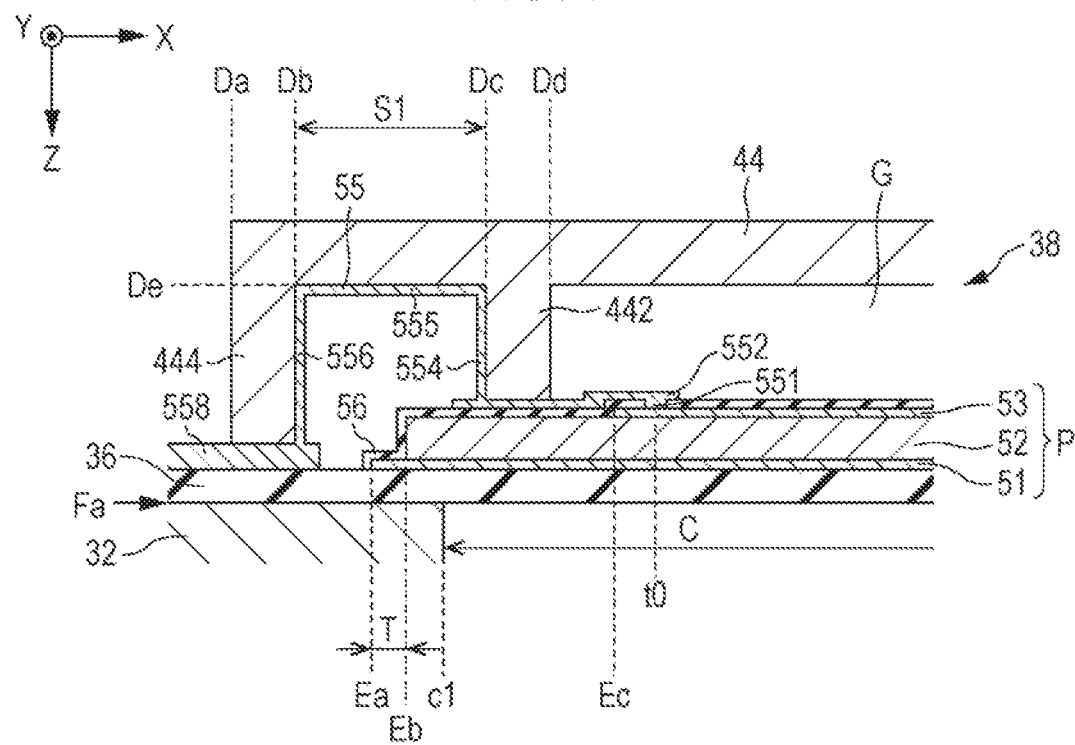
FIG. 7 is a cross-sectional view illustrating a configuration of a piezoelectric device according to a modification of the first embodiment.

Note that in the first embodiment, although a case where the column portion 442 is installed in the region not overlapping with the pressure chamber C when viewed in a plan view is described as an example, the configuration is not limited thereto, for example, as illustrated in FIG. 7, the column portion 442 may be installed in a region overlapping with the pressure chamber C when viewed in a plan view. FIG. 7 is a cross-sectional view illustrating a configuration of the piezoelectric device 38 according to a modification of the first embodiment, and corresponds to FIG. 4. In the configuration in FIG. 7, the column portion 442 of the protective substrate 44 is located on the positive side in the X direction (the inside of the pressure chamber C) when viewed from the end portion c1 of the pressure chamber C in a plan view. Accordingly, in comparison with a case where the column portion 442 is installed on the negative side in the X direction when viewed from the end portion c1 of the pressure chamber C in a plan view, the second electrode 53 can be shortened in the X direction. With this configuration, since an electrode area in the active portion of the piezoelectric element P when viewed from the Z direction can be reduced, it is possible to suppress the power consumption and reduce the occurrence of electric crosstalk.

Additionally, according to the configuration in FIG. 7, since the lead-out wiring 55 can be formed on the column portion 442 at a position in the vicinity of the active portion of the piezoelectric element P, electrostatic capacity between the first electrode 51 and the lead-out wiring 55 of the second electrode 53 in the inactive portion of the piezoelectric element P can be reduced. Accordingly, this also makes it possible to suppress the power consumption and reduce the occurrence of electric crosstalk.

Second Embodiment

Figure 8:
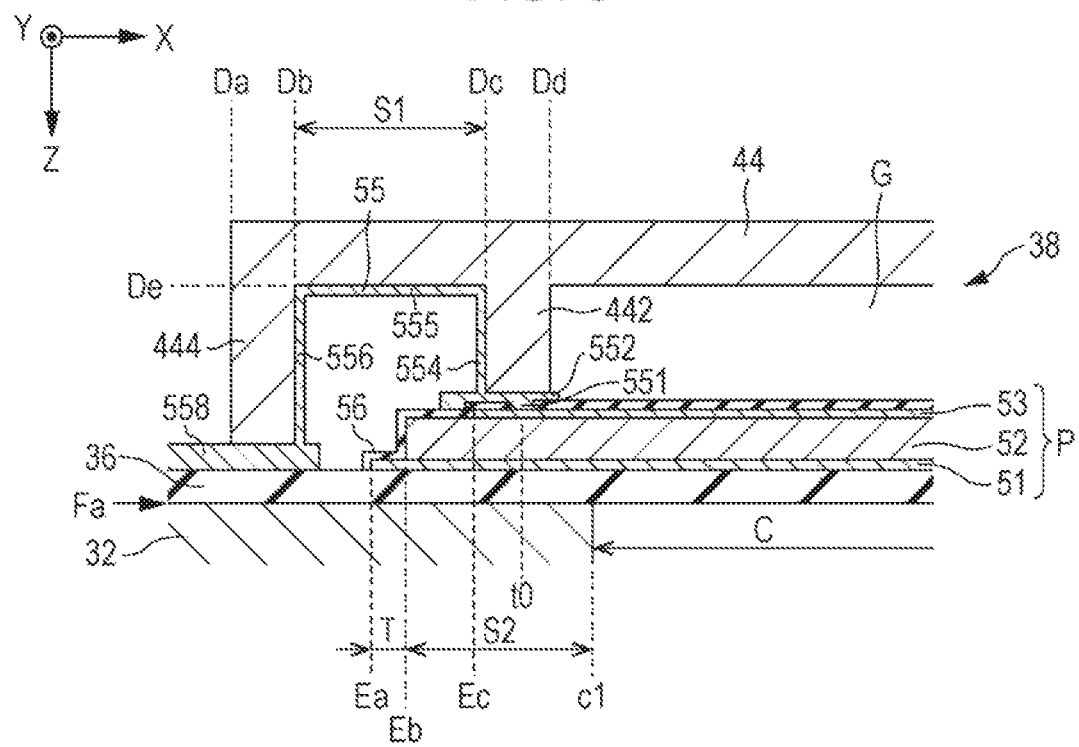
FIG. 8 is a cross-sectional view illustrating a configuration of a piezoelectric device according to a second embodiment.

A second embodiment of the invention will be described. Note that in each mode described as an example below, the elements whose actions or functions are the same as those in the first embodiment are given the reference numerals used in the description in the first embodiment, and detailed descriptions thereof will be appropriately omitted. FIG. 8 is a cross-sectional view illustrating a configuration of the piezoelectric device 38 according to the second embodiment, and corresponds to FIG. 4. FIG. 4 illustrates a case where the electric connection point t0 between the second electrode 53 and the lead-out wiring 55 does not overlap with the column portion 442 of the protective substrate 44 when viewed in a plan view as an example. In the second embodiment, a case where the electric connection point t0 between the second electrode 53 and the lead-out wiring 55 overlaps with the column portion 442 when viewed in a plan view is described as an example.

According to the configuration in FIG. 8, in the same manner as the first embodiment, by providing the lead-out wiring 55 of the second electrode 53 on the wall surface Dc of the column portion 442 provided in the internal space G of the protective substrate 44, the lead-out wiring 55 of the second electrode 53 can be led out without passing on the upper surface of the first electrode 51. Accordingly, while ensuring the insulation property between the electrodes 51 and 53 of the piezoelectric element P, the displacement amount of the vibration plate 36 can be ensured.

Additionally, in the configuration in FIG. 8, the wiring 552 of the lead-out wiring 55 extends from a position on the negative side in the X direction relative to the wall surface Dc of the column portion 442 to a position on the positive side in the X direction relative to the wall surface Dd of the column portion 442 when viewed in a plan view. The end portion Ec of the second electrode 53 is located on the negative side in the X direction when viewed from the wall surface Dc of the column portion 442 in a plan view. Accordingly, the connection terminal 551 and the second electrode 53 can be connected to each other such that the connection point t0 between the connection terminal 551 of the wiring 552 and the second electrode 53 overlaps with the column portion 442 of the protective substrate 44 when viewed in a plan view.

According to the configuration as described above, in comparison with a case where the electric connection point t0 between the second electrode 53 and the lead-out wiring 55 is located on the positive side in the X direction relative to the column portion 442 (the inside of the pressure chamber C) when viewed in a plan view, the wiring 552 being an intermediate wiring can be shortened in the X direction. Accordingly, electrostatic capacity between the wiring 552 of the second electrode 53 in the inactive portion of the piezoelectric element P and the first electrode 51 can be reduced. This makes it possible to suppress the power consumption and reduce the occurrence of electric crosstalk.

In the configuration in FIG. 8, in the same manner as the configuration in FIG. 4, the column portion 442 of the protective substrate 44 overlaps with the region S2 when viewed in a plan view. The pressure chamber C is not formed in the flow path substrate 32 in the region S2, the column portion 442 is therefore less likely to be affected by the vibration of the vibration plate 36, and thus the close-contact property of the column portion 442 with the piezoelectric element P can be improved. Additionally, since the pressure chamber C is not present in a region where the column portion 442 overlaps with the flow path substrate 32 (a region below the column portion 442) when viewed in a plan view, fixing strength of the protective substrate 44 can be ensured.

Figure 9:
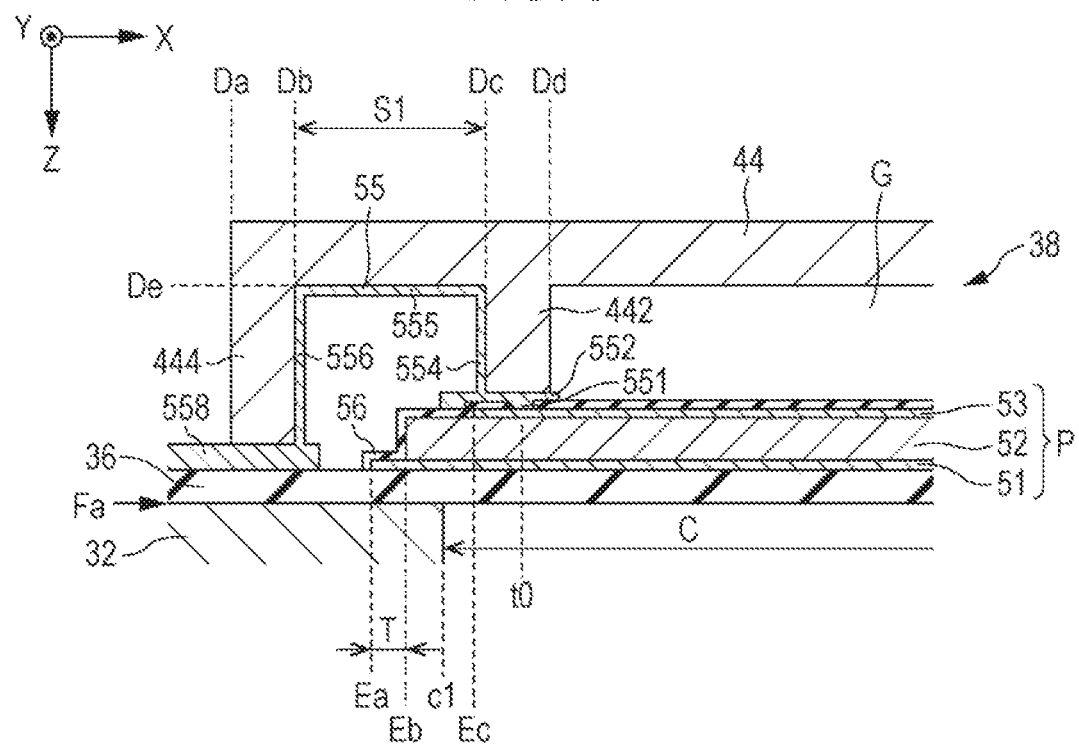
FIG. 9 is a cross-sectional view illustrating a configuration of a piezoelectric device according to a modification of the second embodiment.

Note that in the second embodiment, although a case where the column portion 442 is installed in the region not overlapping with the pressure chamber C when viewed in a plan view is described as an example, the configuration is not limited thereto, for example, as illustrated in FIG. 9, the column portion 442 may be installed in a region overlapping with the pressure chamber C when viewed in a plan view. FIG. 9 is a cross-sectional view illustrating a configuration of the piezoelectric device 38 according to a modification of the second embodiment, and corresponds to FIG. 8. In the configuration in FIG. 9, the column portion 442 of the protective substrate 44 is located on the positive side in the X direction (the inside of the pressure chamber C) when viewed from the end portion c1 of the pressure chamber C in a plan view. Accordingly, in comparison with a case where the column portion 442 is installed on the negative side in the X direction when viewed from the end portion c1 of the pressure chamber C in a plan view, the second electrode 53 can be shortened in the X direction. With this configuration, since an electrode area in the active portion of the piezoelectric element P when viewed from the Z direction can be reduced, it is possible to suppress the power consumption and reduce the occurrence of electric crosstalk.

Additionally, according to the configuration in FIG. 9, since the lead-out wiring 55 can be formed on the column portion 442 at a position in the vicinity of the active portion of the piezoelectric element P, electrostatic capacity between the first electrode 51 and the lead-out wiring 55 of the second electrode 53 in the inactive portion of the piezoelectric element P can be reduced. Accordingly, this also makes it possible to suppress the power consumption and reduce the occurrence of electric crosstalk.

Third Embodiment

Figure 10:
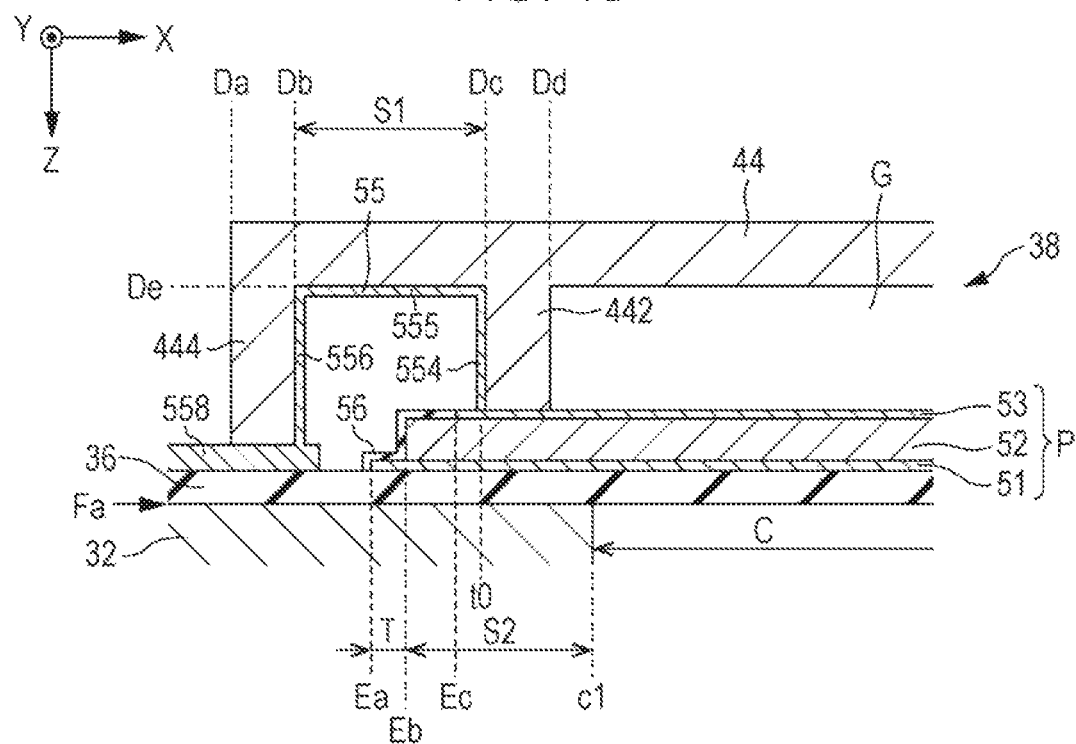
FIG. 10 is a cross-sectional view illustrating a configuration of a piezoelectric device according to a third embodiment.

A third embodiment of the invention will be described. FIG. 10 is a cross-sectional view illustrating a configuration of the piezoelectric device 38 according to the third embodiment, and corresponds to FIG. 4. FIG. 4 illustrates a case where the connection to the second electrode 53 is performed with the connection terminal 551 of the lead-out wiring 55 of the second electrode 53 as an example. In FIG. 10, a case where the second electrode 53 is connected to the wiring 554, which is formed on the wall surface Dc of the column portion 442, of the lead-out wiring 55 of the second electrode 53 without the intermediate wiring (wiring 552) interposed therebetween will be described as an example. Accordingly, in the configuration in FIG. 10, a portion where the wiring 554 of the lead-out wiring 55 is connected to the second electrode 53 serves as the connection point t0 between the lead-out wiring 55 and the second electrode 53.

According to the configuration in FIG. 10, in the same manner as the first embodiment, by providing the lead-out wiring 55 of the second electrode 53 on the wall surface Dc of the column portion 442 provided in the internal space G of the protective substrate 44, the lead-out wiring 55 of the second electrode 53 can be led out without passing on the upper surface of the first electrode 51. Accordingly, while ensuring the insulation property between the electrodes 51 and 53 of the piezoelectric element P, the displacement amount of the vibration plate 36 can be ensured.

Additionally, in the configuration in FIG. 10, an end portion of the wiring 554 of the lead-out wiring 55 on the positive side in the Z direction (lower end portion) is bonded on the upper surface of the second electrode 53. According to this configuration, the wiring 554 of the lead-out wiring 55 is directly connected to the second electrode 53 without the intermediate wiring (wiring 552) of the lead-out wiring 55 interposed therebetween. Accordingly, in comparison with a case where the intermediate wiring (wiring 552) is shortened as the configuration in FIG. 8, the electrostatic capacity between the wiring 552 of the second electrode 53 and the first electrode 51 in the inactive portion of the piezoelectric element P is further reduced. This makes it possible to suppress the power consumption and reduce the occurrence of electric crosstalk. Additionally, since the end portion Ec of the second electrode 53 extends to the negative side in the X direction relative to the column portion 442, a length of the second electrode 53 in the X direction can be increased than that in the configuration in FIG. 4. This makes it possible to increase a vibration range of the vibration plate 36 in the X direction.

Figure 11:
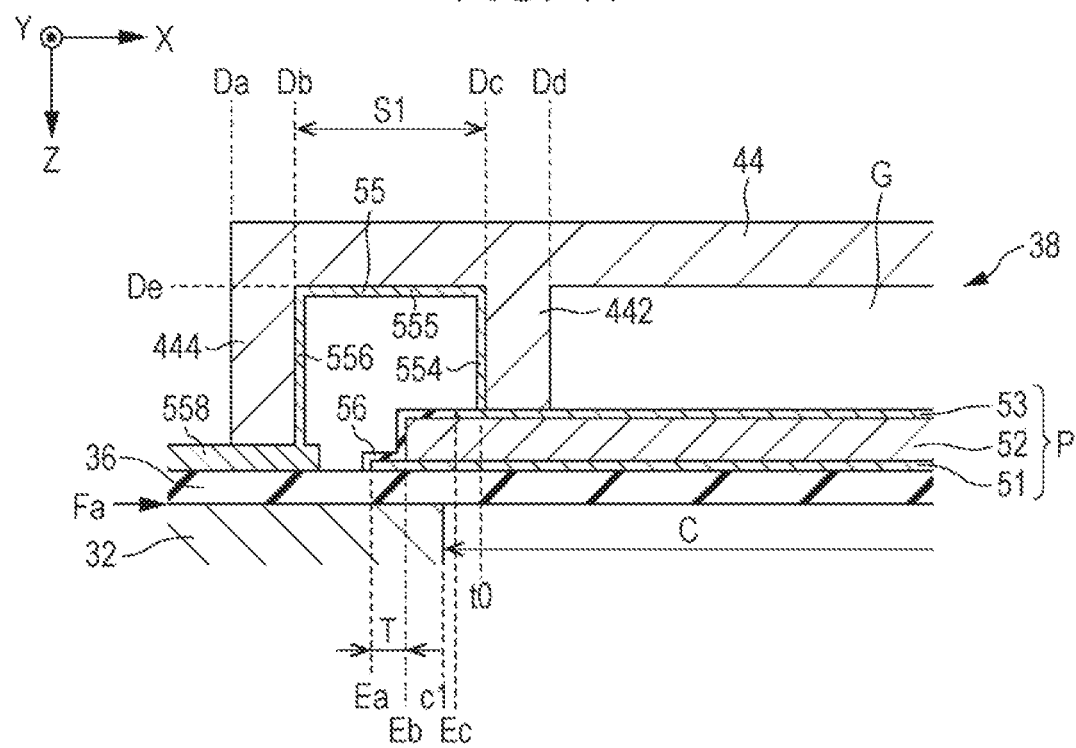
FIG. 11 is a cross-sectional view illustrating a configuration of a piezoelectric device according to a modification of the third embodiment.

Note that in the third embodiment, although a case where the column portion 442 is installed in the region not overlapping with the pressure chamber C when viewed in a plan view is described as an example, the configuration is not limited thereto, for example, as illustrated in FIG. 11, the column portion 442 may be installed in a region overlapping with the pressure chamber C when viewed in a plan view. FIG. 11 is a cross-sectional view illustrating a configuration of the piezoelectric device 38 according to a modification of the third embodiment, and corresponds to FIG. 10. In the configuration in FIG. 11, the column portion 442 of the protective substrate 44 is located on the positive side in the X direction (the inside of the pressure chamber C) when viewed from the end portion c1 of the pressure chamber C in a plan view. Accordingly, in comparison with a case where the column portion 442 is installed on the negative side in the X direction when viewed from the end portion c1 of the pressure chamber C in a plan view, the second electrode 53 can be shortened in the X direction. With this configuration, since an electrode area in the active portion of the piezoelectric element P when viewed from the Z direction can be reduced, it is possible to suppress the power consumption and reduce the occurrence of electric crosstalk.

Additionally, according to the configuration in FIG. 11, since the lead-out wiring 55 can be formed on the column portion 442 at a position in the vicinity of the active portion of the piezoelectric element P, electrostatic capacity between the first electrode 51 and the lead-out wiring 55 of the second electrode 53 in the inactive portion of the piezoelectric element P can be reduced. Accordingly, this also makes it possible to suppress the power consumption and reduce the occurrence of electric crosstalk.

Modification

Each aspect and embodiment described above as an example may be variously modified. Specific modification aspects will be described below as examples. Two or more aspects arbitrarily selected from examples described below and aspects described above may appropriately be combined in a range in which they are not inconsistent with each other.

1. In the embodiments described above, although a serial head which iteratively reciprocates the carriage 242 on which the liquid discharge head 26 is mounted along the X direction is described as an example, the invention can also be applied to a line head in which the liquid discharge head 26 is arrayed across the entire width of the medium 12.

2. In the embodiments described above, although the liquid discharge head 26 using a piezoelectric method in which the piezoelectric element which applies mechanical vibration to the pressure chamber is used as a pressure generation portion is described as an example, a liquid discharge head using a heating method in which a thermal element which generates bubbles in the pressure chamber by heating is used as the pressure generation portion can also be employed.

3. The liquid discharge apparatus 100 described as an example in the embodiments described above may be employed to various types of apparatuses such as a facsimile machine, a copying machine, or the like, in addition to an apparatus dedicated to printing. However, the application of the liquid discharge apparatus 100 according to the invention is not limited to printing. For example, the liquid discharge apparatus which discharges a color material solution is used as a manufacturing apparatus for forming a color filter of a liquid crystal display device, an organic EL (Electro Luminescence) display, an FED (surface emission display), or the like. Additionally, the liquid discharge apparatus that discharges a solution of a conductive material is used as a manufacturing apparatus for forming a wire or an electrode of a wiring substrate. Additionally, the apparatus is also used as a chip manufacturing apparatus which discharges a solution of a bioorganic material as a kind of liquid.

What is claimed is:

1. A liquid discharge head comprising:
a pressure chamber communicating with a nozzle through which liquid is discharged;

a piezoelectric element having a lamination structure in which a first electrode, a piezoelectric body layer, and a second electrode are laminated in this order;

a vibration plate installed between the first electrode of the piezoelectric element and the pressure chamber;

a protective substrate in which an internal space for housing the piezoelectric element is formed; and a lead-out wiring connected to the second electrode, wherein a column portion is provided at a position overlapping with the piezoelectric element in the internal space of the protective substrate when viewed in a plan view, and the lead-out wiring is provided on a wall surface of the column portion.

2. The liquid discharge head according to claim 1, wherein the lead-out wiring of the second electrode is routed from the second electrode to an outside of the protective substrate via the wall surface of the column portion and a wall surface of the internal space.

3. A liquid discharge apparatus comprising:
the liquid discharge head according to claim 2.

4. The liquid discharge head according to claim 1, wherein the column portion overlaps with the pressure chamber when viewed in a plan view.

5. A liquid discharge apparatus comprising:
the liquid discharge head according to claim 4.

6. The liquid discharge head according to claim 1, wherein an end portion of the piezoelectric body layer is located on an outside of the pressure chamber relative to an end portion of the pressure chamber when viewed in a plan view, the column portion overlaps with a region between the end portion of the piezoelectric body layer and the end portion of the pressure chamber when viewed in a plan view.

7. A liquid discharge apparatus comprising:
the liquid discharge head according to claim 6.

8. The liquid discharge head according to claim 1, wherein an electric connection point between the lead-out wiring and the second electrode overlaps with the column portion when viewed in a plan view.

9. A liquid discharge apparatus comprising:
the liquid discharge head according to claim 8.

10. The liquid discharge head according to claim 1, wherein a width of the lead-out wiring of the second electrode is smaller than a width of the column portion.

11. A liquid discharge apparatus comprising:
the liquid discharge head according to claim 10.

12. The liquid discharge head according to claim 1, wherein a width of the lead-out wiring of the second electrode is larger than a width of the column portion.

13. A liquid discharge apparatus comprising:
the liquid discharge head according to claim 12.

14. A liquid discharge apparatus comprising:
the liquid discharge head according to claim 1.

15. A piezoelectric device comprising:
a piezoelectric element having a lamination structure in which a first electrode, a piezoelectric body layer, and a second electrode are laminated in this order on a vibration plate; and a lead-out wiring connected to the second electrode, wherein the piezoelectric element is housed in an internal space of a protective substrate, a column portion is provided at a position overlapping with the piezoelectric element in the internal space of the protective substrate when viewed in a plan view, and the lead-out wiring is provided on a wall surface of the column portion.

* * * * *